(12) United States Patent
Mukai et al.

(10) Patent No.: US 8,289,107 B2
(45) Date of Patent: Oct. 16, 2012

(54) ACOUSTIC WAVE DEVICE HAVING NARROWER-PITCH ELECTRODES, NORMALLY-SHAPED ELECTRODES AND APODIZED ELECTRODES

(75) Inventors: Takao Mukai, Takatsuki (JP); Daisuke Ajima, Hakusan (JP); Masaru Yata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 350 days.

(21) Appl. No.: 12/778,252

(22) Filed: May 12, 2010

(65) Prior Publication Data
US 2010/0301969 A1   Dec. 2, 2010

(30) Foreign Application Priority Data

May 27, 2009 (JP) ................................. 2009-127830

(51) Int. Cl.
*H03H 9/25* (2006.01)
*H03H 9/64* (2006.01)
(52) U.S. Cl. ..................... 333/196; 310/313 C
(58) Field of Classification Search .......... 333/193–196; 310/313 B, 313 C, 313 D
See application file for complete search history.

(56) References Cited

U.S. PATENT DOCUMENTS 6,025,763 A * 2/2000 Morimoto ..................... 333/195
7,728,699 B2 * 6/2010 Fujii et al. ..................... 333/196
2009/0121810 A1 * 5/2009 Fujii et al. ..................... 333/195

FOREIGN PATENT DOCUMENTS

| EP | 1 168 614 A2 | 1/2002 |
| EP | 1 249 934 A2 | 10/2002 |
| EP | 1 394 940 A1 | 3/2004 |
| JP | 09-214281 | * 8/1997 |
| WO | 2008/038481 A1 | 4/2008 |

OTHER PUBLICATIONS

Official Communication issued in corresponding European Patent Application No. 10163368.3, mailed on Apr. 11, 2012.

* cited by examiner

*Primary Examiner* — Barbara Summons
(74) *Attorney, Agent, or Firm* — Keating & Bennett, LLP (57) ABSTRACT

A longitudinally-coupled resonator-type acoustic wave device includes first to third IDT electrodes disposed on a piezoelectric material and first and second reflectors disposed in acoustic wave propagation directions. Each of any two IDT electrodes adjacent to each other in the acoustic wave propagation directions, of the first to third IDT electrodes, has a narrower-pitch electrode finger portion at an edge thereof adjacent to the other IDT electrode. Most portions of the first to third IDT electrodes are apodized, and the narrower-pitch electrode finger portions and the electrode finger portions adjacent thereto are normally shaped.

6 Claims, 9 Drawing Sheets

ACOUSTIC WAVE DEVICE HAVING NARROWER-PITCH ELECTRODES, NORMALLY-SHAPED ELECTRODES AND APODIZED ELECTRODES

BACKGROUND OF THE INVENTION

1. Field of the Invention

The present invention relates to an acoustic wave device using boundary acoustic waves or surface acoustic waves and in particular, to an acoustic wave device including longitudinally-coupled resonators.

2. Description of the Related Art

Mobile communication terminals typified by cell phones include many components such as a filter and a duplexer. In order to address downsizing demands, acoustic wave devices have been often used as such filters in recent years.

In addition to surface acoustic waves, boundary acoustic waves have been used as acoustic waves. Filters using boundary acoustic waves do not need resonant space for resonating waves to be propagated, so the filters can be made smaller than filters using surface acoustic waves accordingly. However, filters using boundary acoustic waves have a stronger effect of confining acoustic waves in the waveguide than filters using surface acoustic waves. Thus, transverse-mode ripples enter the passband, thereby deteriorating the passband characteristic of the filter.

Transverse-mode ripples also tend to appear when narrowing the cross width of the interdigital transducer (IDT) electrodes of a surface acoustic wave filter or boundary acoustic wave filter in order to downsize the filter.

In view of the foregoing, WO2008/038481 proposes the configuration of a boundary acoustic wave filter including longitudinally-coupled resonators that suppress transverse-mode ripples.

Figure 9:
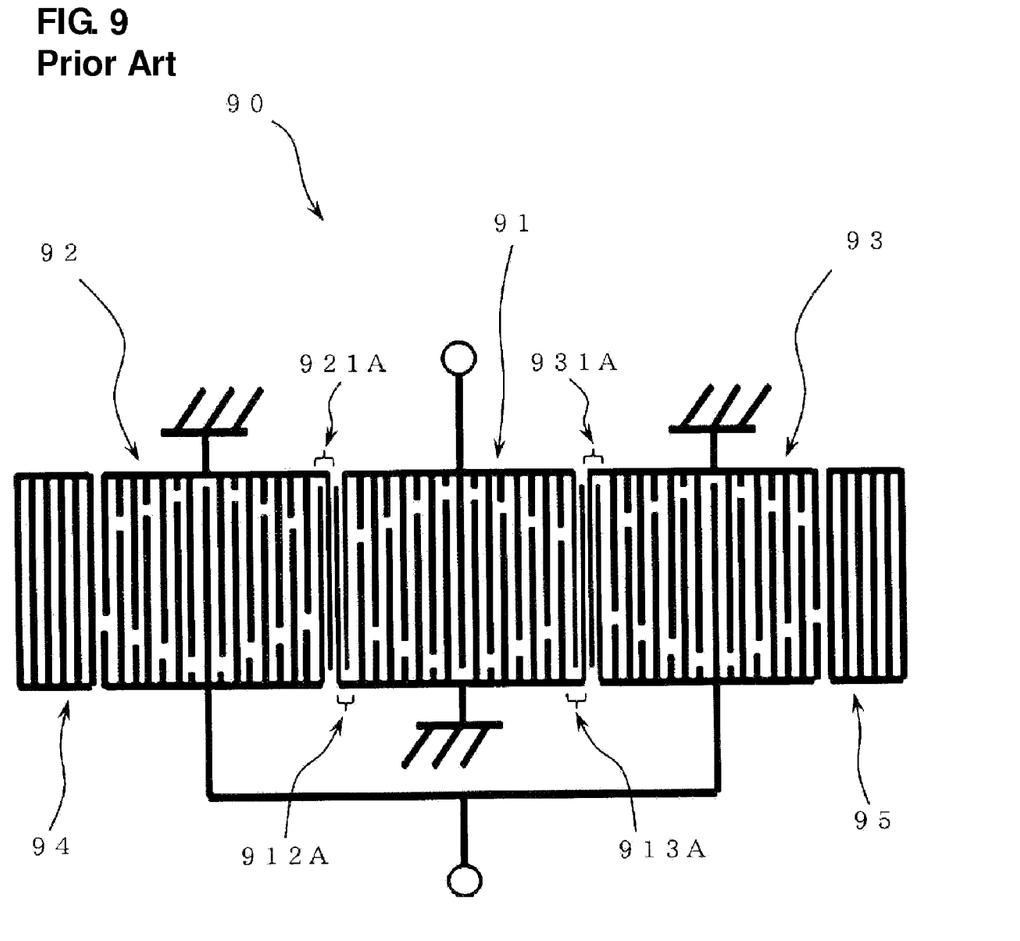
FIG. 9 is a schematic plan view showing a related-art boundary acoustic wave device.

The electrodes of the acoustic wave filter disclosed in WO2008/038481 are formed as shown in FIG. 9. A first IDT electrode 91, a second IDT electrode 92, a third IDT electrode 93, and reflectors 94 and 95 are disposed on a piezoelectric material in such a manner that the electrodes 92 and 93 are located at the edges in acoustic wave propagation directions, of the electrode 91 and that the reflectors 94 and 95 are located at the edges in the acoustic wave propagation directions, of the electrodes 92 and 93. The adjacent IDT electrodes 91 and 92 include adjacent narrower-pitch electrode finger portions 912A and 921A, respectively, while the adjacent IDT electrodes 91 and 93 include adjacent narrower-pitch electrode finger portions 913A and 931A, respectively. The cycle of these electrode fingers is shorter than that of the other electrode fingers. The portions of the IDT electrodes 91 to 93 except for the respective narrower-pitch electrode finger portions are apodized.

It is known that this configuration can suppress transverse-mode ripples to improve the passband characteristic of the filter.

Unfortunately, the configuration disclosed in WO2008/038481 has the following problems.

The filter including resonators composed of IDT electrodes whose portions except for the narrower-pitch electrode finger portion are apodized can suppress transverse-mode ripples to improve its passband characteristic; however, it cannot obtain sufficient attenuations at frequencies lower than the passband.

For this reason, use of this filter as a diversity filter or a duplexer filter fails to achieve a required attenuation.

SUMMARY OF THE INVENTION

Accordingly, preferred embodiments of the present invention suppress and prevent transverse-mode ripples to improve the passband characteristics of a filter as well as enhance the frequency characteristics at frequencies lower than the passband.

An acoustic wave device according to a preferred embodiment of the present invention includes a piezoelectric material; a first interdigital transducer (IDT) electrode disposed on the piezoelectric material; second and third IDT electrodes disposed on the piezoelectric material and at both edges in acoustic wave propagation directions, of the first IDT electrode; and first and second reflectors disposed on the piezoelectric material and at edges in the acoustic wave propagation directions, of the second and third IDT electrodes. Each of any two IDT electrodes located adjacent to each other in the acoustic wave propagation directions, of the first to third IDT electrodes, has a narrower-pitch electrode finger portion at an edge thereof adjacent to the other IDT electrode, the narrower-pitch electrode finger portion having an electrode finger cycle shorter than a cycle of the other electrode fingers of the IDT electrode. The narrower-pitch electrode finger portion and an electrode finger portion adjacent thereto, of each of the first to third IDT electrodes, are normally shaped and portions other than the normally-shaped electrode finger portions are apodized. The ratio of the total of the normally-shaped electrode finger portions adjacent to the narrower-pitch electrode finger portions to the total of the first to third IDT electrodes except for the narrower-pitch electrode finger portions is about 3% to about 20%.

The first IDT electrode may be subjected to apodization so that an electrode finger at the center in the acoustic wave propagation directions of the first IDT electrode has the largest cross width and so that electrode fingers closer to both edges of the first IDT electrode, the both edges being edges where the narrower-pitch electrode finger portions are disposed, have smaller cross widths. A portion surrounded by an envelope formed due to the apodization may take the shape of a rhombus, for example.

The ratio may preferably be about 3% to about 12%, for example.

Boundary acoustic waves may be used as acoustic waves.

The acoustic wave device may further include: a first dielectric layer laminated on the piezoelectric material; and a second dielectric layer laminated on the first dielectric layer. Boundary acoustic waves may propagate at higher sound velocity through the second dielectric layer than through the first dielectric layer.

Surface acoustic waves may be used as acoustic waves.

The acoustic wave device according to a preferred embodiment of the present invention preferably is a filter where apodization is performed on the portions of the filter except for the narrower-pitch electrode finger portions and the electrode finger portions adjacent to the narrower-pitch electrode finger portions and where the electrode finger portions adjacent to the narrower-pitch electrode finger portions are normally shaped. This can suppress and prevent transverse-mode ripples to improve the passband characteristic of the filter as well as enhance the frequency characteristic at frequencies lower than the passband.

Other features, elements, steps, characteristics and advantages of the present invention will become more apparent from the following detailed description of preferred embodiments of the present invention (with reference to the attached drawings).

DETAILED DESCRIPTION OF THE PREFERRED EMBODIMENTS

Now, preferred embodiments of the present invention will be described with reference to the accompanying drawings.

Figure 1:
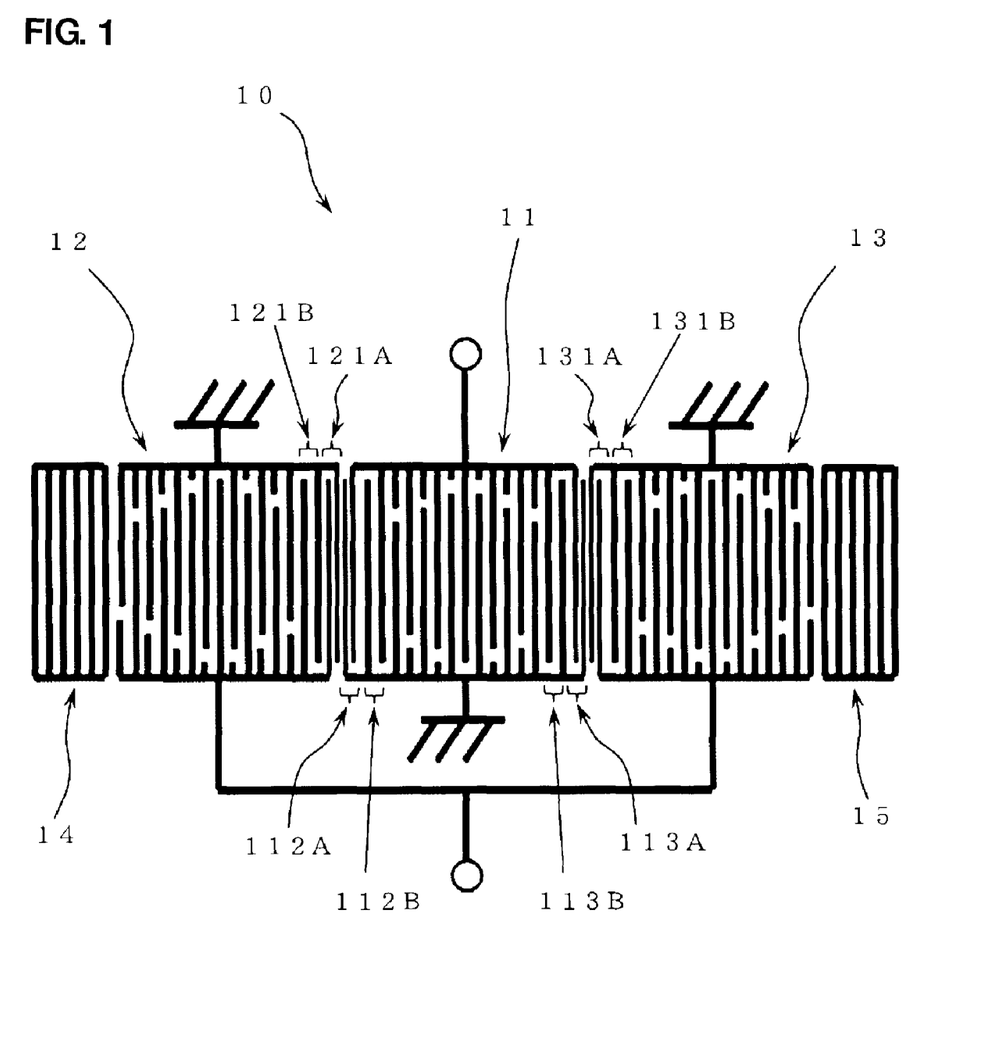
FIG. 1 is a schematic plan view showing a boundary acoustic wave device according to a preferred embodiment of the present invention.
Figure 2:
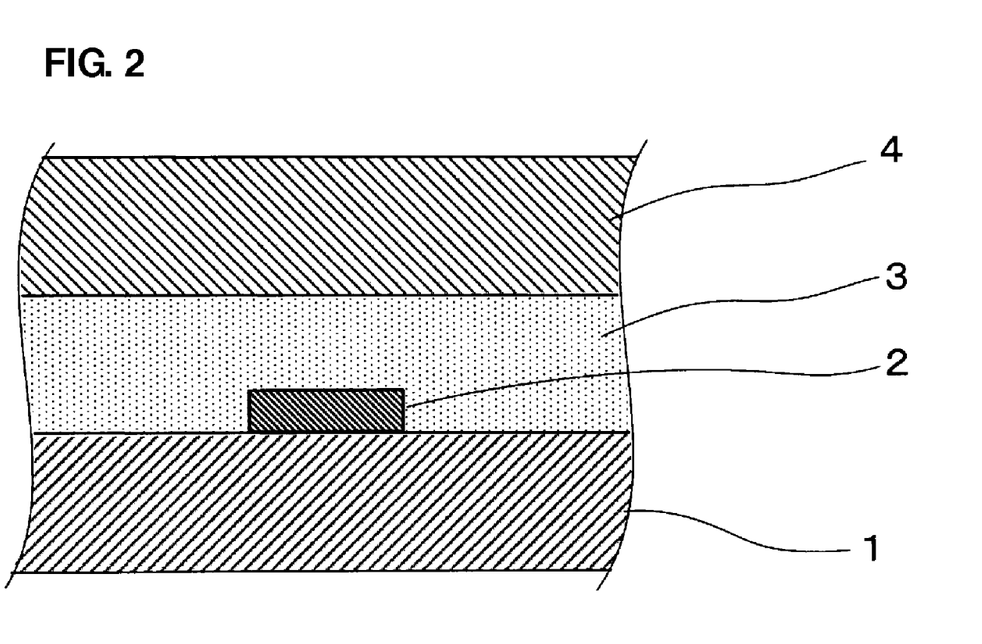
FIG. 2 is an enlarged schematic sectional view of the boundary acoustic wave device according to the preferred embodiment of the present invention shown in FIG. 1.

FIG. 1 shows a schematic plan view of a boundary acoustic wave device according to a preferred embodiment of the present invention. FIG. 2 shows an enlarged schematic sectional view of a major portion of the boundary acoustic wave device according to the preferred embodiment.

As shown in FIG. 2, the boundary acoustic wave device according to this preferred embodiment includes a piezoelectric material 1, a first dielectric layer 3 laminated on the piezoelectric material 1 and having a predetermined thickness, and a second dielectric layer 4 laminated on the first dielectric layer 3 and having a predetermined thickness. An electrode 2 is disposed between the piezoelectric material 1 and first dielectric layer 3. This structure allows efficiently confined boundary acoustic waves to propagate between the piezoelectric material 1 and first dielectric layer 3.

The piezoelectric material 1 is preferably $LiNbO_3$, for example. Alternatively, the piezoelectric material 1 may be made of $LiTaO_3$ or crystal quartz, for example. The first dielectric layer 3 is preferably made of silicon dioxide, and the second dielectric layer 4 is preferably made of silicon nitride, for example. The first dielectric layer 3 is preferably formed with a thickness of about 1.8 μm, and the second dielectric layer 4 is preferably formed with a thickness of about 3 μm, for example. The materials for these dielectric layers are not limited to silicon dioxide or silicon nitride and may be silicon oxynitride, silicon, aluminum nitride, alumina, silicon carbide, or the like. The second dielectric layer 4 is preferably made of a material through which boundary acoustic waves propagate at higher sound velocity than through the material of which the first dielectric layer 3 is made. This configuration improves the effect of confining boundary acoustic wave propagation mode. The electrode 2 is preferably formed by laminating a layer made of Pt on the piezoelectric material and then laminating a layer made of Al.

For the thickness of the electrode, the Pt layer is preferably about 0.1 μm thick and the Al layer is preferably about 0.3 μm thick, for example. Instead of the Pt layer, the element 2 may include a layer made of Cu, Au, or an alloy thereof.

The electrodes of a boundary acoustic wave filter 10 shown in FIG. 1 are preferably configured as follows. A first IDT electrode 11, a second IDT electrode 12, a third IDT electrode 13, and reflectors 14 and 15 are disposed on a piezoelectric material in such a manner that the electrodes 12 and 13 are located at both edges in the acoustic wave propagation directions, of the electrode 11 and that the reflectors 14 and 15 are located at the edges in the acoustic wave propagation directions, of the electrodes 12 and 13. The adjacent IDT electrodes 11 and 12 include adjacent narrower-pitch electrode finger portions 112A and 121A, respectively, while the adjacent IDT electrodes 11 and 13 have adjacent narrower-pitch electrode finger portions 113A and 131A, respectively. The cycle of these electrode fingers is shorter than that of the other electrode fingers.

Most portions of the IDT electrodes 11 to 13, that is, the portions except for the narrower-pitch electrode finger portions and normally-shaped electrode finger portions to be described later are apodized. This apodization is performed so that the electrode finger at the center of each of the IDT electrode 11 to 13 has the largest cross width and so that electrode fingers closer to both edges of the IDT electrode, where the narrower-pitch electrode finger portion 112A, 113A, 121A, or 131A is disposed, have smaller cross widths. That is, the apodization is performed so that the portion surrounded by the envelope formed due to the apodization takes the shape of a rhombus.

The narrower-pitch electrode finger portions 112A, 113A, 121A, and 131A are normally shaped. Not-apodized, normally-shaped electrode finger portions 112B, 113B, 121B, and 131B are formed adjacent to the narrower-pitch electrode finger portions 112A, 113A, 121A, and 131A.

The design parameters according to this preferred embodiment will be described below. For the first IDT electrode 11, the total number of electrode fingers is 35, including 7 narrower-pitch electrode fingers at each edge, totaling 14, and 2 not-apodized, normally-shaped electrode fingers at each edge, totaling 4. For each of the second IDT electrode 12 and third IDT electrode 13, the total number of electrode fingers is 54, including 7 narrower-pitch electrode fingers, and 2 not-apodized, normally-shaped electrode fingers. The first to third IDT electrodes preferably have the common largest cross width of about 130 μm and the common smallest cross width of about 78 μm, for example. The first to third IDT electrodes also preferably have a common pitch of about 1.82 μm for the narrower-pitch electrode finger portions and a common pitch of about 1.92 μm for the other electrode fingers, for example.

As is apparent from above, the number of electrode fingers constituting the main portions of the first to third IDT electrodes except for the narrower-pitch electrode finger portions is 115 obtained by subtracting the total number of the narrower-pitch electrode fingers, 28, from the total number of electrode fingers, 143, and the total number of not-apodized, normally-shaped electrode fingers of the first to third IDT electrodes is 8. Accordingly, the ratio of the total of the not-apodized, normally-shaped electrode finger portions to the total of the IDT electrode main portions except for the narrower-pitch electrode finger portions is approximately 7%, for example.

Figure 3:
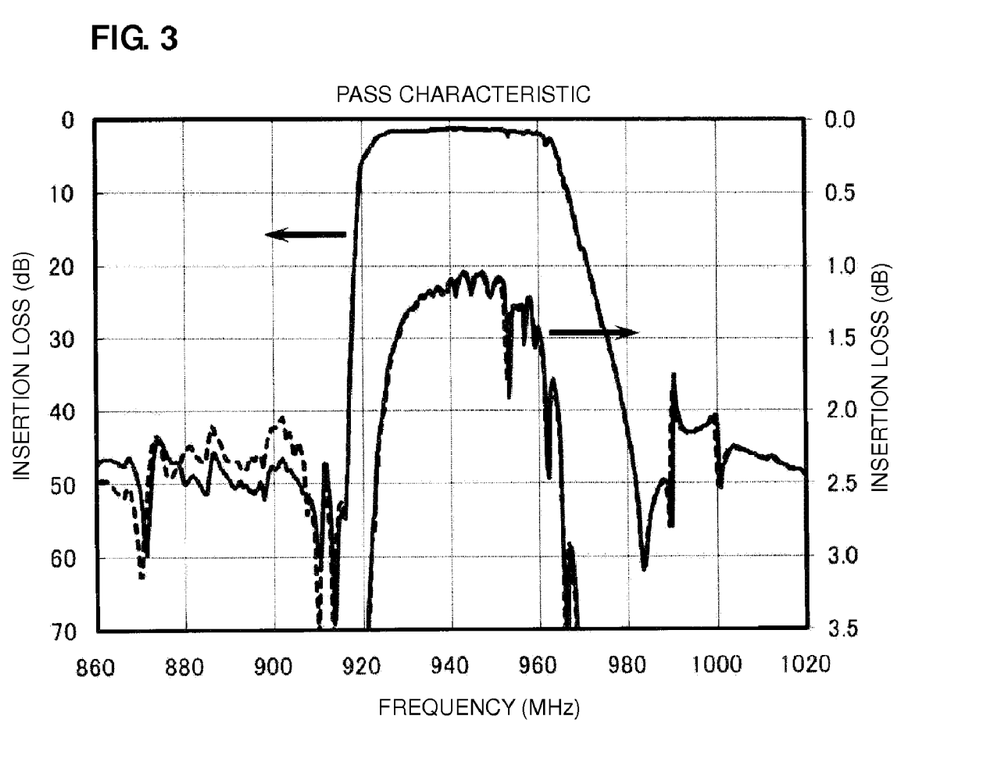
FIG. 3 is a graph showing the relationship between the frequency characteristic of the boundary acoustic wave device according to the preferred embodiment shown in FIG. 1 and the frequency characteristic of a related-art boundary acoustic wave device.

FIG. 3 shows the relationship between the frequency characteristic of the boundary acoustic wave filter according to this preferred embodiment configured under the above-mentioned conditions and the frequency characteristic of a related-art boundary acoustic wave filter. In this graph, the solid line indicates the characteristic of the boundary acoustic wave filter according to this preferred embodiment, while the dotted line indicates the characteristic of the related-art boundary acoustic wave filter.

As is apparent from the graph, the boundary acoustic wave filter according to this preferred embodiment suppresses and prevents transverse-mode ripples around the center of its passband, as with the related-art boundary acoustic wave filter, as well as obtains attenuations of 43 dB or more at frequencies lower than the passband. Accordingly, the boundary acoustic wave filter according to this preferred embodiment exhibits sufficient frequency characteristics both in the passband and at frequencies lower than the passband.

Figure 4:
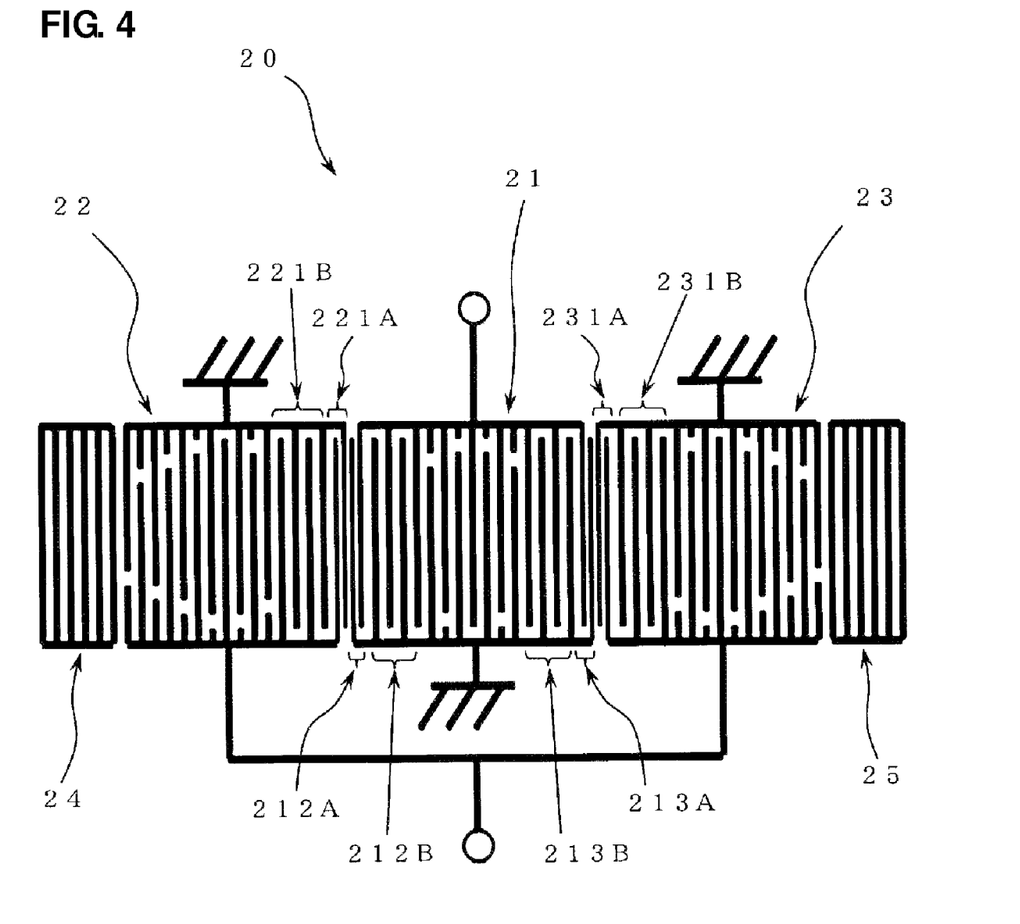
FIG. 4 is a schematic plan view showing a boundary acoustic wave device according to a comparative example.

FIG. 4 shows a comparative example with respect to this preferred embodiment. As with the longitudinally-coupled resonator-type boundary acoustic wave filter according to this preferred embodiment, this comparative longitudinally-coupled resonator-type boundary acoustic wave filter includes a first IDT electrode 21, a second IDT electrode 22, and a third IDT 23 disposed on a piezoelectric material. The IDT electrodes 22 and are located at both edges in the acoustic wave propagation directions, of the first IDT electrode 21. Reflectors 24 and 25 are disposed at the edges in the acoustic wave propagation directions, of the IDT electrodes 22 and 23. The adjacent IDT electrodes 21 and 22 include adjacent narrower-pitch electrode finger portions 212A and 221A, respectively, while the adjacent IDT electrodes 21 and 23 include adjacent narrower-pitch electrode finger portions 213A and 231A, respectively. The cycle of these electrode fingers is shorter than that of the other electrode fingers. Most portions of each of the IDT electrodes 21 to 23 are apodized. This apodization is performed so that the electrode finger at the center of each IDT electrode has the largest cross width and so that electrode fingers closer to both edges of each IDT electrode, where the narrower-pitch electrode finger portions are disposed, have smaller cross widths. Disposed adjacent to the narrower-pitch electrode finger portions are not-apodized, normally-shaped electrode finger portions 212B, 213B, 221B, and 231B. The only difference between the boundary acoustic wave filter according to the comparative example and that according to this preferred embodiment is that, in the comparative example, the ratio of the total of the not-apodized, normally-shaped electrode finger portions to the total of the IDT electrode main portions except for the narrower-pitch electrode finger portions is about 25%.

Figure 5:
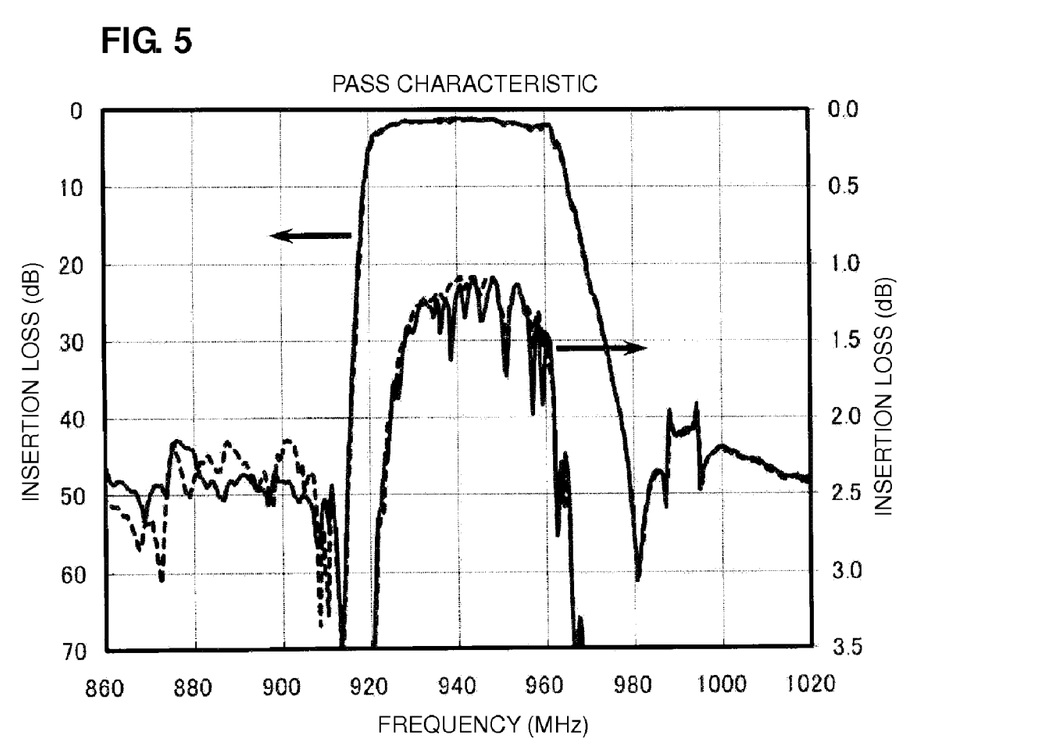
FIG. 5 is a graph showing the relationship between the frequency characteristic of the boundary acoustic wave device according to the comparative example and the frequency characteristic of a related-art boundary acoustic wave device.

FIG. 5 shows the relationship between the frequency characteristic of the boundary acoustic wave filter according to the comparative example and the frequency characteristic of a related-art boundary acoustic wave filter. In this graph, the solid line indicates the characteristic of the comparative boundary acoustic wave filter and the dotted line indicates that of the related-art boundary acoustic wave filter.

From the graph, it is understood that, although the comparative boundary acoustic wave filter obtains sufficient attenuations at low frequencies lower than its passband, transverse-mode ripples deteriorate around the center of the passband. In this comparative example, transverse-mode ripples are 0.35 dB or more and a sufficient pass loss characteristic cannot be obtained.

Figure 6:
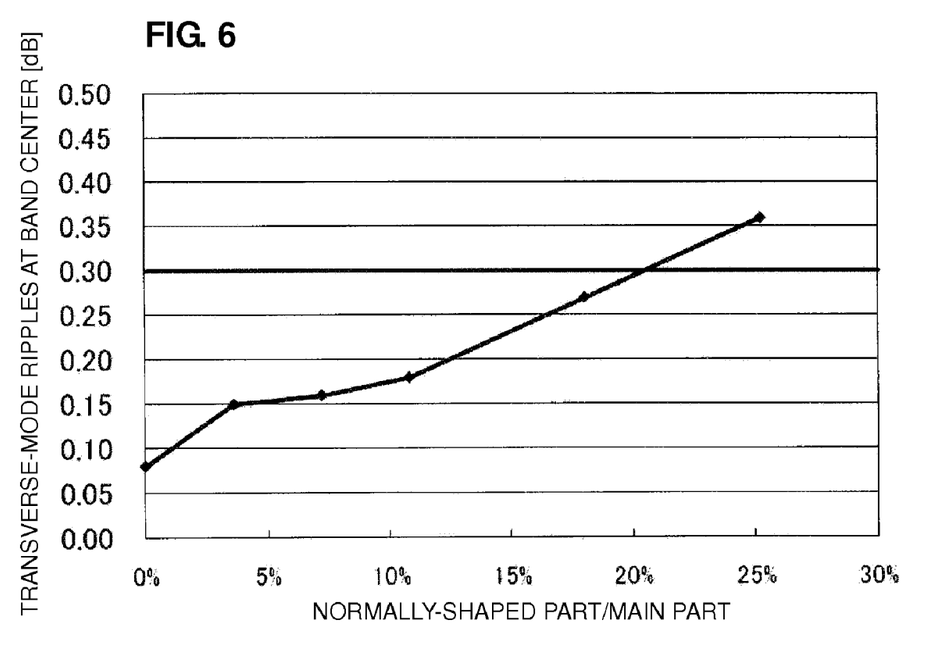
FIG. 6 is a graph showing the relationship between the ratio of the normally-shaped portion to the IDT electrode main portion and transverse-mode ripples at the center of the passband of the filer.
Figure 7:
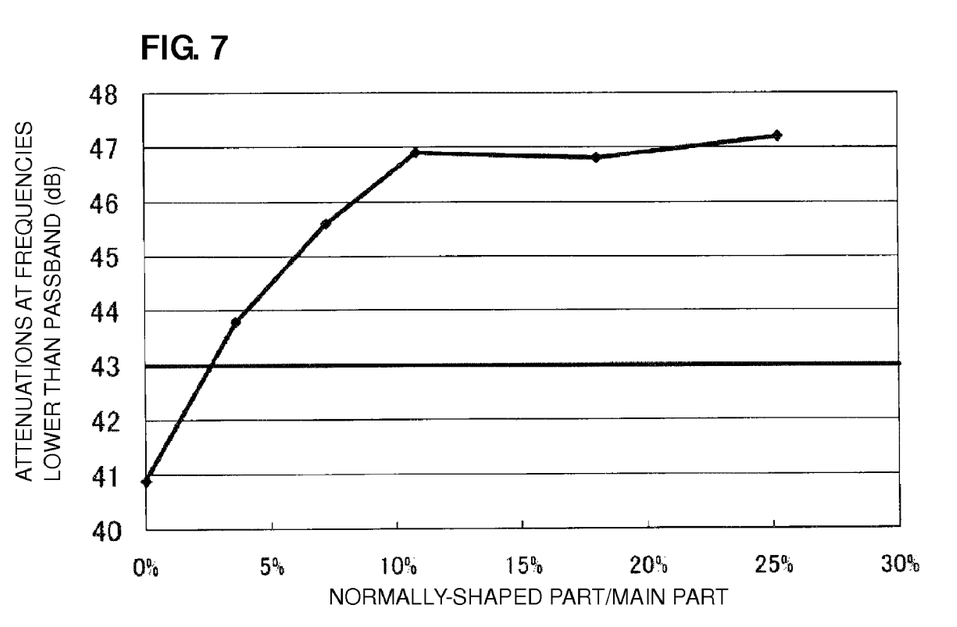
FIG. 7 is a graph showing the relationship between the ratio of the normally-shaped portion to the IDT electrode main portion and attenuations at low frequencies in the passband.

FIG. 6 shows the relationship between the ratio of the not-apodized, normally-shaped electrode finger portion to the IDT electrode main portion and transverse-mode ripples around the center of the passband of the filter. FIG. 7 shows the relationship between the ratio of the not-apodized, normally-shaped electrode finger portion to the IDT electrode main portion and attenuations at frequencies lower than the passband.

From these graphs, it is understood that, in order to suppress transverse-mode ripples around the passband center to about 0.3 dB or less and obtain attenuations of about 43 dB or more at frequencies lower than the passband, the ratio of the not-apodized, normally-shaped electrode finger portion to the IDT electrode main portion is preferably about 3% to about 20%, for example. More preferably, the ratio is about 3% to about 12% so that transverse-mode ripples are about 0.2 dB or less, for example.

Figure 8:
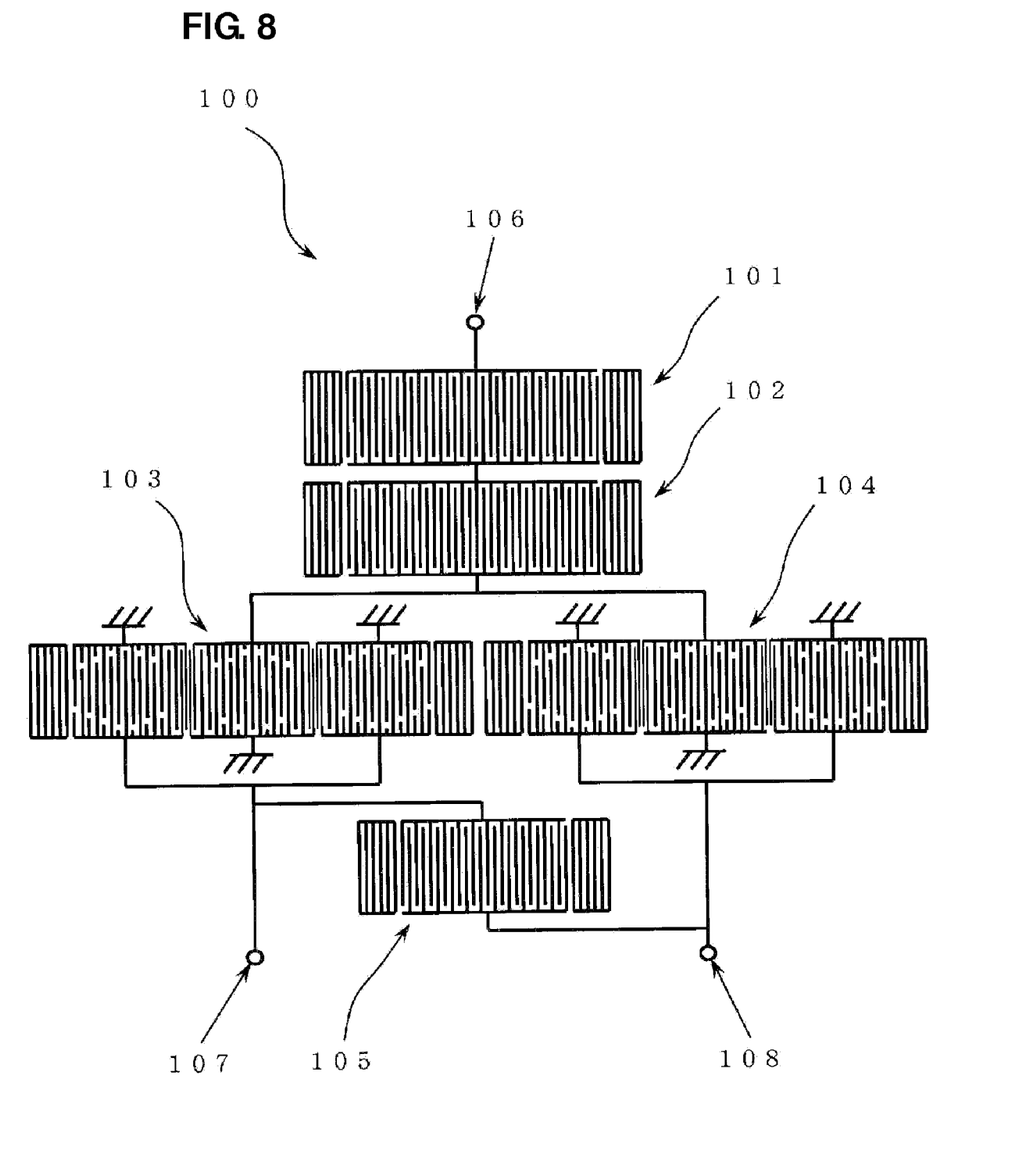
FIG. 8 is a schematic plan view showing a boundary acoustic wave device according to another preferred embodiment of the present invention.

FIG. 8 shows a boundary acoustic wave device according to another preferred embodiment of the present invention.

In a boundary acoustic wave filter 100 according to this preferred embodiment, one-port boundary acoustic wave resonators 101 and 102 are connected to an imbalance terminal 106 in series. The resonators 101 and 102 are connected to a first balance terminal 107 and a second balance terminal 108 with longitudinally-coupled resonator-type boundary acoustic wave filters 103 and 104 therebetween. The filters 103 and 104 each preferably include three IDT electrodes. The longitudinally-coupled resonator-type boundary acoustic wave filters 103 and 104 are configured like the boundary acoustic wave filter 10 according to the previous preferred embodiment, which has been described with reference to FIGS. 1 and 2.

In this case, a signal inputted into the imbalance terminal 106 is outputted from the balance terminals 107 and 108 about 180° out of phase. This allows balance-imbalance conversion. In this preferred embodiment, as in the previous preferred embodiment, apodization is performed on the portions except for the narrower-pitch electrode finger portions and the electrode finger portions adjacent to the narrower-pitch electrode finger portions, and the electrode finger portions adjacent to the narrower-pitch electrode finger portions are normally shaped. Accordingly, a filter can be obtained that has a balance-imbalance function as well as suppresses and prevents transverse-mode ripples to improve its passband characteristic and exhibit sufficient frequency characteristics at frequencies lower than the passband.

The present invention is not limited to the above-mentioned parameters. For example, the number of the normally-shaped electrode fingers adjacent to the narrower-pitch electrode finger portion may be one. Also, the longitudinally-coupled resonator-type filter may be composed of five IDT electrodes rather than three IDT electrodes. Also, filters in two stages may be longitudinally connected.

While the preferred embodiments have been described using boundary acoustic wave devices, they are applicable to surface acoustic wave devices.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:
1. An acoustic wave device comprising:
a piezoelectric material;
a first interdigital transducer electrode disposed on the piezoelectric material;
second and third interdigital transducer electrodes disposed on the piezoelectric material and at both edges in acoustic wave propagation directions, of the first interdigital transducer electrode; and first and second reflectors disposed on the piezoelectric material and at edges in the acoustic wave propagation directions, of the second and third interdigital transducer electrodes; wherein each of any two interdigital transducer electrodes adjacent to each other in the acoustic wave propagation directions, of the first to third interdigital transducer electrodes, includes a narrower-pitch electrode finger portion at an edge thereof adjacent to the other interdigital transducer electrode, the narrower-pitch electrode finger portion having an electrode finger cycle shorter than a cycle of the other electrode fingers of the interdigital transducer electrode;

the narrower-pitch electrode finger portion and an electrode finger portion adjacent thereto, of each of the first to third interdigital transducer electrodes, are normally shaped and portions other than the normally-shaped electrode finger portions are apodized; and a ratio of a total of the normally-shaped electrode finger portions adjacent to the narrower-pitch electrode finger portions to a total of the first to third interdigital transducer electrodes except for the narrower-pitch electrode finger portions is about 3% to about 20%.

2. The acoustic wave device according to claim 1, wherein the first interdigital transducer electrode is apodized so that an electrode finger at the center in the acoustic wave propagation directions of the first interdigital transducer electrode, has the largest cross width and so that electrode fingers closer to both edges of the first interdigital transducer electrode, the both edges being edges where the narrower-pitch electrode finger portions are disposed, have smaller cross widths than the largest cross width, and a portion surrounded by an envelope due to the first interdigital transducer electrode being apodized has a rhombus shape.

3. The acoustic wave device according to claim 1, wherein the ratio is about 3% to about 12%.

4. The acoustic wave device according to claim 1, wherein boundary acoustic waves are used as acoustic waves.

5. The acoustic wave device according to claim 4, further comprising:

a first dielectric layer laminated on the piezoelectric material; and a second dielectric layer laminated on the first dielectric layer; wherein boundary acoustic waves propagate at higher sound velocity through the second dielectric layer than through the first dielectric layer.

6. The acoustic wave device according to claim 1, wherein surface acoustic waves are used as acoustic waves.

* * * * *